(12) United States Patent
Sogabe

(10) Patent No.: US 9,224,513 B2
(45) Date of Patent: Dec. 29, 2015

(54) ZINC OXIDE SINTERED COMPACT TABLET AND MANUFACTURING METHOD THEREOF

(75) Inventor: Kentaro Sogabe, Tokyo (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 151 days.

(21) Appl. No.: 13/699,139

(22) PCT Filed: May 18, 2011

(86) PCT No.: PCT/JP2011/061461
§ 371 (c)(1),
(2), (4) Date: Dec. 13, 2012

(87) PCT Pub. No.: WO2011/145665
PCT Pub. Date: Nov. 24, 2011

(65) Prior Publication Data
US 2013/0200314 A1 Aug. 8, 2013

(30) Foreign Application Priority Data
May 21, 2010 (JP) .................. 2010-117845

(51) Int. Cl.
*H01B 1/08* (2006.01)
*C04B 35/453* (2006.01)
(Continued)

(52) U.S. Cl.
CPC . *H01B 1/08* (2013.01); *B82Y 30/00* (2013.01); *C01G 9/02* (2013.01); *C04B 35/453* (2013.01);
(Continued)

(58) Field of Classification Search
CPC ........ H01B 1/08; C04B 35/453; C23C 14/24; C23C 14/34
USPC ...................... 252/519.5–519.54; 204/192.15
See application file for complete search history.

(56) References Cited

U.S. PATENT DOCUMENTS

| | | | | |
|---|---|---|---|---|
| 5,952,086 A | * | 9/1999 | Ohnishi et al. | 428/220 |
| 6,242,080 B1 | * | 6/2001 | Kondo | 428/210 |

(Continued)

FOREIGN PATENT DOCUMENTS

| | | |
|---|---|---|
| JP | 03-050148 | 3/1991 |
| JP | 03050148 | 3/1991 |

(Continued)

OTHER PUBLICATIONS

Taiwanese Office Action dated Sep. 12, 2013, from corresponding Taiwanese Application No. 100117732.

(Continued)

*Primary Examiner* — Mark Kopec
(74) *Attorney, Agent, or Firm* — Katten Muchin Rosenman LLP

(57) ABSTRACT

Provided is a zinc oxide sintered compact tablet enabling a transparent conductive film having no pinholes defects to be stably obtained during vacuum deposition film formation by suppressing the occurrence of the splashing phenomenon. A zinc oxide sintered compact tablet having hexagonal crystal structure, wherein when the integrated intensity of surface (103) and surface (110) found through X-ray diffraction analysis using CuKα radiation is taken to be $I_{(103)}$ and $I_{(110)}$ respectively, the orientation of the uniaxially pressed surface that is expressed by $I_{(103)}/(I_{(103)}+I_{(110)})$ is 0.48 or more is obtained by performing pressurized formation of a granulated powder composed of a zinc oxide powder or a powder mixture of zinc oxide and an added element as a dopant and having a percentage of donut shaped secondary particles of 50% or more, sintering at normal pressure and a temperature of 800° C. to 1300° C., and further performing reduction treatment by maintaining the normal pressure sintered compact in a vacuum at a pressure of $1 \times 10^{-3}$ Pa or more and at a temperature of 800° C. to 1300° C. for no less than 1 minute and no longer than 10 minutes.

11 Claims, 1 Drawing Sheet

(103)Surface (101)Surface

(51) Int. Cl.
  *C23C 14/24* (2006.01)
  *C04B 35/626* (2006.01)
  *C23C 14/08* (2006.01)
  *C01G 9/02* (2006.01)
  *B82Y 30/00* (2011.01)

(52) U.S. Cl.
  CPC ..... *C04B 35/62655* (2013.01); *C04B 35/62675* (2013.01); *C04B 35/62695* (2013.01); *C23C 14/086* (2013.01); *C04B 2235/3206* (2013.01); *C04B 2235/3217* (2013.01); *C04B 2235/3224* (2013.01); *C04B 2235/3225* (2013.01); *C04B 2235/3229* (2013.01); *C04B 2235/3232* (2013.01); *C04B 2235/3239* (2013.01); *C04B 2235/3244* (2013.01); *C04B 2235/3251* (2013.01); *C04B 2235/3256* (2013.01); *C04B 2235/3258* (2013.01); *C04B 2235/3286* (2013.01); *C04B 2235/3289* (2013.01); *C04B 2235/3293* (2013.01); *C04B 2235/3298* (2013.01); *C04B 2235/3409* (2013.01); *C04B 2235/52* (2013.01); *C04B 2235/54* (2013.01); *C04B 2235/5436* (2013.01); *C04B 2235/5445* (2013.01); *C04B 2235/5454* (2013.01); *C04B 2235/6562* (2013.01); *C04B 2235/6567* (2013.01); *C04B 2235/6581* (2013.01); *C04B 2235/664* (2013.01); *C04B 2235/767* (2013.01); *C04B 2235/77* (2013.01); *C04B 2235/787* (2013.01); *C04B 2235/9653* (2013.01)

(56) References Cited

U.S. PATENT DOCUMENTS

| | | | |
|---|---|---|---|
| 7,994,508 | B2 | 8/2011 | Ye |
| 7,998,324 | B2 * | 8/2011 | Watanabe et al. ........ 204/298.13 |
| 8,294,148 | B2 | 10/2012 | Ye |
| 8,389,135 | B2 | 3/2013 | Nakayama et al. |
| 2004/0038446 | A1 * | 2/2004 | Takeda et al. ................. 438/104 |
| 2009/0057132 | A1 * | 3/2009 | Imanishi et al. ........... 204/192.1 |
| 2009/0185971 | A1 * | 7/2009 | Yokoyama et al. ........ 423/594.3 |

FOREIGN PATENT DOCUMENTS

| | | |
|---|---|---|
| JP | 06088218 | 3/1994 |
| JP | 06248427 | 9/1994 |
| JP | 6-340468 | 12/1994 |
| JP | 06-340468 | 12/1994 |
| JP | 06340468 | 12/1994 |
| JP | 2002121067 | 4/2002 |
| JP | 2002121067 A * | 4/2002 |
| JP | 2004-175616 | 6/2004 |
| JP | 2004-175616 A | 6/2004 |
| JP | 2006117462 | 5/2006 |
| JP | 2006265054 | 10/2006 |
| JP | 2007056351 | 3/2007 |
| JP | 2007056352 | 3/2007 |
| JP | 2007-210807 A | 8/2007 |
| JP | 2007-210807 A | 8/2007 |
| JP | 2009-184877 | 8/2009 |
| JP | 2010-034027 A | 2/2010 |
| JP | 2010-535431 | 11/2010 |
| JP | 2010-535431 A | 11/2010 |
| KR | 10-2009-0024684 A | 3/2009 |
| TW | 200913279 | 3/2009 |
| WO | 2009/018509 | 2/2009 |
| WO | 2009018509 A1 | 2/2009 |
| WO | 20091018509 A1 | 2/2009 |

OTHER PUBLICATIONS

International Search Report dated Aug. 16, 2011 from the corresponding International Application No. PCT/JP2011/061461.

Office Action dated Dec. 30, 2013, from the corresponding Korean Application No. 10-2012-7032374.

Office Action dated Apr. 15, 2014, from the corresponding Japanese Application No. JP 2012-515916.

Radhouane Bel Hadj Tahar, Structural and electrical properties of aluminum-doped zinc oxide films prepared by sol-gel process, Journal of the European Ceramic Society 25 (2005) 3301-3306 (Jun. 6, 2005).

Extended European Search Report dated Jan. 8, 2014 for the Corresponding European Patent Application No. 11783599.1.

Zhou X D et al: "Synthesis of PMMA-Ceramics Nanocomposites by Spray Process", Journal of Materials Science Letters, Chapman and Hall Ltd. London, GB, vol. 21, No. 7, Apr. 1, 2002, pp. 577-580, XP001125588, ISSN: 0261-8028, DOI: 10.1023/A:1015473424734 "p. 577, lines 1-12", p. 578, column 1; table 1; figure 5.

Bertrand G et al: "Spray-dried ceramic powders: A quantitative correlation between slurry characteristics and shapes of the granules", Chemical Engineering Science, Oxford, GB, vol. 60, No. 1, Jan. 1, 2005, pp. 95-102, XP027646004, ISSN: 0009-2509; [retrieved on Jan. 1, 2005].

Database Medline (Online) US National Library of Medicine (NLM), Bethesda, MD, US; Sep. 15, 2003, Iskandar Ferry et al: "Control of the morphology of nanostructured particles prepared by the spray drying of a nanoparticle sol.", XP002717910, Database accession No. NLM12962663 "abstract" & Journal of Colloid and Interface Science Sep. 15, 2003, vol. 265, No. 2, Sep. 15, 2003, pp. 296-303, ISSN: 0021-9797.

* cited by examiner

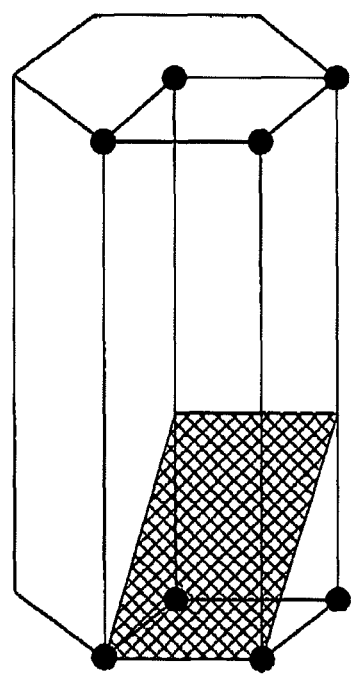 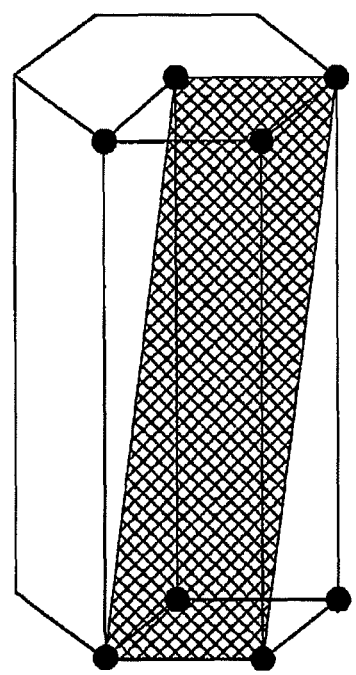
(103)Surface		(101)Surface

ZINC OXIDE SINTERED COMPACT TABLET AND MANUFACTURING METHOD THEREOF

TECHNICAL FIELD

The present invention relates to a zinc oxide sintered compact tablet that is used as a vapor source when manufacturing an oxide transparent conductive film using the vacuum deposition method, and to a manufacturing method for obtaining this zinc oxide sintered compact tablet.

BACKGROUND ART

Transparent oxide conductive film has high conductance and high transmittance in the visible light range. Therefore, transparent oxide conductive film is not only used in the electrodes of solar batteries, liquid crystal display elements, and all kinds of photo detectors, by taking advantage of its reflection and absorption characteristics in wavelengths in the near-infrared light range, it is also used as heat ray reflective film that is used in window glass in automobiles and buildings, all kinds of antistatic film, a transparent heating element for defogging for use in refrigerated showcases and the like.

Zinc oxide (ZnO) that includes aluminum or gallium as a dopant, tin oxide ($SnO_2$) that includes antimony or fluorine as a dopant, indium oxide ($In_2O_3$) that includes tin as a dopant and the like are used in transparent oxide conductive film. Particularly, indium oxide film that includes tin as a dopant, also called ITO (Indium Tin Oxide) film, is widely used because it is especially easy to obtain transparent conductive film that has low resistance.

As a manufacturing method for these kinds of transparent oxide conductive films, there are a vacuum deposition method in which a vapor source is heated in a vacuum and the evaporated raw material is deposited on a substrate, a sputtering method in which the material of a target is sputtered out and caused to be deposited on an opposing substrate, and a method of applying a coating liquid for forming a transparent conductive layer. The vacuum deposition method and the sputtering method are effective methods when using a material having low vapor pressure, or when it is necessary to precisely control the film thickness, and because operation is very simple, these methods are widely used in industry.

The vacuum deposition method is a method in which normally, a solid (or liquid) as a vapor source is heated inside a vacuum at a pressure of about $10^{-3}$ Pa to $10^{-2}$ Pa, and after once separating the gas molecules or atoms, causing them to condense again as a thin film on the surface of a substrate. Typically, as the method for heating the vapor source there is the resistive heating method (RH method), and the electron beam heating method (EB method, electron beam vapor deposition method), however, there is also a method of hearing using laser light, or a high-frequency induction heating method. Moreover, a flash vapor deposition method, arc plasma vapor deposition method and reactive vapor deposition method are known and also included in the vacuum deposition method. Also in the vacuum deposition method, methods of ionizing vaporized materials or reactive gas such as in the high-density plasma assist vapor deposition (HEPE) method are collectively called as an ion plating method.

In manufacturing ITO film, in addition to the sputtering method that is generally used, ion plating methods such as electron beam vapor deposition method and high-density plasma assist vapor deposition method, and other vacuum depositions method are often used, and as the vapor source in the vacuum deposition method, an ITO tablet (also called an ITO pellet) that is composed of an ITO sintered compact is used.

However, ITO film, even though it is easy to obtain the desired product quality during manufacturing, the main raw material indium is an expensive rare earth metal, so there are limits to how much the cost can be reduced.

On the other hand, in the case of a transparent zinc oxide conductive film that is composed of zinc oxide, or zinc oxide that includes aluminum or gallium as a dopant, the main raw material zinc is very inexpensive, light transmittance is high, and the plasma-resistant characteristics are good, so is widely used as electrodes in thin-film silicon solar batteries. Moreover, the band gap of zinc oxide is wide at approximately 3.4 eV, and the exciton energy is high, so in recent years, there have been many reports of applications in light-emitting diodes. Furthermore, application in transparent thin-film transistors is also expected. In a transparent zinc oxide conductive film, the reason for including boron group elements such aluminum and gallium, which have a larger valence number than zinc, is that it is possible to reduce the resistivity (specific electrical resistance).

In the manufacturing of transparent zinc oxide conductive film as well, mainly the sputtering method is used. In the sputtering method, a zinc oxide sintered compact target is used as the raw material, however, and up until now zinc oxide sintered compact targets having various crystalline orientation having been proposed in order to obtain a film with excellent homogeneity. For example, in JP 06-88218 (A), a zinc oxide sintered compact target in which the crystallinity of surface (002) is greater than the crystallinity of surface (101) is proposed; in JP 06-340468 (A), a zinc oxide sintered compact target in which the crystallinity of surface (101) is large is proposed; and in JP 2002-121067, a zinc oxide sintered compact target in which the crystallinity of surface (110) is large is proposed.

For this transparent zinc oxide conductive film as well, as in the case of ITO film, manufacturing the film using the vacuum deposition method is being studied, and various types of zinc oxide sintered compact tablets have been proposed such as disclosed in JP 06-248427 (A), JP 2006-117462 (A), JP 2007-56351 (A) and JP 2007-56352 (A).

The zinc oxide sintered compact tablet used in this vacuum sputtering method, from the aspect of preventing fracturing or cracking during film formation, is a tablet that has a relative density (ratio of the bulk density with respect to the theoretical density) of about 50% to 70%. However, the zinc oxide sintered compact is a material having higher resistance than an ITO sintered compact, so when compared with a sintered compact target having a high relative density of 90% or more such as used in the sputtering method, the resistivity value increases by the amount that the relative density is low. When the resistivity value of the sintered compact target becomes high, uniform sublimation by the plasma beam or electron beam becomes difficult, and there is a possibility that a splashing phenomenon will occur in which vapor deposition material having a size of several μm to 1000 μm that is mixed with evaporative gas is scattered and collides with the vapor deposition film. This splashing phenomenon is the cause of film defects such as pinhole defects and the like. Therefore, achieving a zinc oxide sintered compact tablet for which the occurrence of this kind of splashing phenomenon is suppressed is desired.

As disclosed in JP 06-248427 (A), JP 2006-117462 (A), JP 2007-56351 (A) and JP 2007-56352 (A), when manufacturing a zinc oxide sintered compact tablet, sintering is performed in an air or nitrogen gas atmosphere, however, JP 06-248427 (A) discloses that, from the aspect of stability during vapor deposition, in order to improve the conductivity, performing heat treatment of the obtained zinc oxide sintered compact tablet in a reducing atmosphere such as an argon atmosphere or vacuum is effective.

Moreover, JP 2007-56351 (A) discloses that the splashing phenomenon can be suppressed by making a half width of the diffraction peak by X-ray diffraction analysis of at least one of surface (100), surface (002) and surface (101) 0.110° or less so as to equalize the particle size of the crystal particles of the zinc oxide sintered compact tablet, and JP 2007-56352 (A) discloses that the splashing phenomenon can be suppressed by reducing the closed pores in the zinc oxide sintered compact tablet. However, suppressing the splashing phenomenon with these techniques is still not sufficient.

RELATED LITERATURE

Patent Literature

[Patent Literature 1] JP 06-88218 (A)
[Patent Literature 2] JP 06-340468 (A)
[Patent Literature 3] JP 2002-121067 (A)
[Patent Literature 4] JP 06-248427 (A)
[Patent Literature 5] JP 2006-117462 (A)
[Patent Literature 6] JP 2007-56351 (A)
[Patent Literature 7] JP 2007-56352 (A)

SUMMARY OF THE INVENTION

Problem to be Solved by the Invention

The object of the present invention is to provide a zinc oxide sintered compact tablet that suppresses the occurrence of a splashing phenomenon when forming a film using vacuum deposition using a zinc oxide sintered compact tablet, including tablets having high resistance for which film formation typically becomes unstable, and makes it possible to stably obtain a transparent zinc oxide conductive film having no defects such as pinholes.

Means for Solving the Problems

The inventors of the present invention upon diligently performing research in order to solve the problems above, obtained knowledge that the splashing phenomenon can be suppressed by using a zinc oxide sintered compact tablet that is obtained by performing a uniaxial pressing of a zinc oxide granulated powder that was manufactured under special manufacturing conditions to obtain a compact, and then sintering this compact at normal pressure.

A feature of the zinc oxide sintered compact tablet of the present invention is that in regards to the crystalline orientation of the uniaxially pressed surface which is the sublimation surface, the (103) crystalline orientation is large. By making the (103) crystalline orientation of the zinc oxide sintered compact tablet large in this way, a remarkable effect is obtained of suppressing splashing and improving the stability of film formation.

More specifically, the zinc oxide sintered compact tablet of the present invention comprises a zinc oxide sintered compact or a zinc oxide including a dopant which has a hexagonal crystal structure, wherein when the integrated intensity of the surface (103) and surface (110) found through X-ray diffraction analysis using CuKα radiation is taken to be $I_{(103)}$ and $I_{(110)}$ respectively, the orientation of the uniaxially pressed surface that is expressed by $I_{(103)}/(I_{(103)}+I_{(110)})$ is 0.48 or more.

The orientation is preferably 0.5 or more, and more preferably 0.55 or more, and most preferably 0.6 or more.

Moreover, preferably, the zinc oxide sintered compact tablet of the present invention is such that the resistivity is $1\times10^{2}\Omega\cdot cm$ or less. Furthermore, preferably the relative density is no less than 50% and no greater than 70%.

The zinc oxide sintered compact tablet of the present invention is obtained by pressurizing granulated powder comprising a zinc oxide powder or a powder mixture of zinc oxide and an added element which will become the dopant, the granulated powder having a percentage of donut shaped secondary particles of 50% or more, to obtain a compact, then sintering the compact at normal pressure and at a temperature of 800° C. to 1300° C.

Preferably, reduction treatment is performed by maintaining the normal pressure sintered compact, which was obtained by the sintering, in a vacuum at a pressure between $1\times10^{-4}$ Pa and $1\times10^{-3}$ Pa and at a temperature of 800° C. to 1300° C. for no less than 1 minute and no longer than 10 minutes.

Particularly, the granulated powder comprising the donut shaped secondary particles is obtained by making a slurry of the base powder, which is the zinc oxide powder or the powder mixture, then spray drying the slurry at a temperature of 80° C. to 100° C. and adjusting the discharge airflow so that the percentage of donut shaped secondary particles is 50% or more.

In this case, preferably part of the granulated powder is calcined at a temperature of 800° C. to 1300° C. for 1 hour to 30 hours. Moreover, preferably, the calcined granulated powder and non-calcined granulated powder are mixed and used.

Effect of the Invention

When using the zinc oxide sintered compact tablet of the present invention when performing film formation by the vacuum deposition method, together with being able to suppress the occurrence of the splash phenomenon and form film with a stable electric discharge, it is possible to prevent the occurrence of damaged material causing defects in the film during film formation, so work to remove damaged material is not necessary, and thus it is possible to greatly improve the productivity when forming transparent conductive film by the vacuum deposition method.

BRIEF DESCRIPTION OF THE DRAWINGS

FIG. 1 is a drawing for explaining the surface (103) and the surface (101) in a zinc oxide sintered compact having a hexagonal crystal structure.

MODES FOR CARRYING OUT THE INVENTION

Zinc Oxide Sintered Compact Tablet (Orientation)

The zinc oxide sintered compact tablet of the present invention is such that in regard to the crystalline orientation of the uniaxially pressed surface, which is the sublimation surface, the (103) crystalline orientation is large. When the integrated intensity of the surface (103) and surface (110) found through X-ray diffraction analysis using CuKα radiation is taken to be $I_{(103)}$ and $I_{(110)}$, and the orientation of the uniaxially pressed surface that is expressed by $I_{(103)}/(I_{(103)}+I_{(110)})$ is 0.48 or more, splashing is suppressed during film formation.

In the case of a conventional zinc oxide sintered compact tablet that was manufactured using normal granulated zinc oxide power, the orientation of the uniaxially pressed surface is less than 0.48. However, with the zinc oxide sintered compact tablet of the present invention, the orientation of that uniaxially pressed surface is 0.48 or more, and preferably 0.50 or more, and even more preferably, 0.6 or more. The larger the (103) crystalline orientation of a sintered compact is, the resistivity of the sintered compacts becomes relatively lower, which is effective for suppressing splashing. By using a surface having this kind of high orientation as the sublimation surface, it is possible to achieve a zinc oxide sintered compact tablet for vacuum deposition for which splashing is suppressed. Moreover, typically, when a sintered compact tablet having high resistance is used for film formation, sublimation becomes heterogeneous, and film formation is unstable, however, when the sintered compact tablet of the present invention is used, the homogeneity of sublimation improves even in the case of high resistance, and it is possible to perform stable film formation while suppressing splashing, and thus is very effective in improving productivity of transparent zinc oxide conductive film. Vacuum deposition referred to here widely includes ion-plating methods such as the electron beam deposition method and high-density plasma assist deposition method, as well as other vacuum deposition methods.

The larger the (103) crystalline orientation is, or in other words, the higher the area peak ratio of surface (103) is, the more effective improvement of film formation stability is. On the other hand, when the orientation of the uniaxially pressed surface is less than 0.48, it becomes easy for splashing to occur and application for mass production is not possible. The reason for this is not yet clear, however, the following reason is conceivable. In other words, it is generally known that in the case of material having crystal orientation anisotropy such as zinc oxide, characteristics such as conductivity will improve in a strong orientation direction. In the present invention, orientation toward the c-axis such as the (103) surface is increased on the sublimation surface. By increasing the (103) crystalline orientation of a zinc oxide sintered compact tablet in this way, the resistivity distribution of the obtained zinc oxide sintered compact tablet is greatly reduced, and homogeneous sublimation becomes possible, and therefore it is conceivable that the occurrence of splashing is suppressed.

A main feature of the zinc oxide sintered compact tablet of the present invention having large (103) crystalline orientation is the improvement of stable film formation even in the case of high resistivity, and this large (103) crystalline orientation is also effective in improving stability of film formation in tablets having low resistance. In other words, application of the present invention is not limited to zinc oxide sintered compact tablets that are manufactured from only zinc oxide, and the present invention can also be applied to zinc oxide sintered compact tablets that are manufactured using zinc oxide that includes various dopants. In other words, when manufacturing a zinc oxide sintered compact tablet of the present invention that has large (103) crystalline orientation, in addition to zinc oxide as the main component, it is also possible to add one or more element that is selected from among boron group elements such as boron, aluminum, gallium, indium and the like, titanium group elements such as titanium, zirconium, hafnium and the like, chromic group elements such as molybdenum, tungsten and the like, vanadium group elements such as vanadium, niobium, tantalum and the like, lanthanoids such as cerium, praseodymium, gadolinium and the like, and yttrium, tin, ruthenium, magnesium, iridium and bismuth as dopants for contributing to conductivity. The amount that these dopants are added is 50% by atoms or less with respect to the total elements other than oxygen, however, from the aspect of low resistance, preferably the amount is 3% to 10% by atoms.

Moreover, for the purpose of lowering resistance, after sintering at normal pressure, it is possible to perform reduction treatment of the obtained zinc oxide sintered compact tablet.

In the case of a sintered compact tablet that is composed of only zinc oxide, preferably the purity is 99.9% or more, and more preferably 99.99% or more. However, the existence of inevitable impurities is allowed within the purity range above.

(Relative Density)

In the zinc oxide sintered compact tablet of the present invention, as in a zinc oxide sintered compact tablet for conventional vacuum deposition, from the aspect of preventing the occurrence of fractures or cracking during film formation, the relative density (ratio of the bulk density with respect to the theoretical density) is 50% to 70%. Here, the theoretical density of zinc oxide that used when calculating the relative density is 5.78 g/cm$^3$.

In order for a relative density in this range, of the manufacturing process of the zinc oxide sintered compact tablet described later, the burning conditions should be regulated in the calcination and/or sintering processes.

(Resistivity)

For the zinc oxide sintered compact tablet of the present invention, when the dopants described above are not included, the resistivity depends on the density, however is about $1.0\times10^5$ Ω·cm to $1.0\times10^9$ Ω·cm. Even in the case of this kind of high resistance, with the zinc oxide sintered compact tablet of the present invention, due to the large (103) crystalline orientation on the sublimation surface, the homogeneity of sublimation is improved and it becomes difficult for the splashing phenomenon to occur.

However, in addition to a large (103) crystalline orientation, for the zinc oxide sintered compact tablet of the present invention, in order to maintain stable discharge, the resistivity is preferably $1\times10^2$ Ω·cm or less, and more preferably 10 Ω·cm or less. When using a zinc oxide sintered compact tablet having a resistivity of at least $1\times10^2$ Ω·cm or less, the local heating is removed, and the material is uniformly heated, so the occurrence of the splashing phenomenon is further suppressed.

In order to make the resistivity $1\times10^2$ Ω·cm or less in this way, after sintering is performed at normal pressure, reduction treatment can be performed for the obtained zinc oxide sintered compact tablet. In the present invention, a smaller resistivity is preferred, however, assuming that the relative density of the zinc oxide sintered compact tablet is 70% or less, the lower limit for the resistivity is at present about $5\times10^{-1}$ Ω·cm.

However, by adding the dopants described above, it is possible to further reduce this resistivity. This differs depending on the type and amount of dopant used, however, by adding a dopant, for a zinc oxide sintered compact tablet having the relative density of 50% or more and 70% or less, it is possible to lower the resistivity to $3\times10^{-1}$ Ω·cm or less, and preferably to $5\times10^{-3}$ Ω·cm to $1\times10^{-4}$ Ω·cm.

In the present invention, the resistivity is a value that was measured using a four probe method, and more specifically, is a value that was measured using a four probe resistivity meter Loresta EP (Mitsubishi Chemical Analytech Co., Ltd, MCP-T360).

[Manufacturing Method for Zinc Oxide Sintered Compact Tablet]

(Manufacturing Donut Shaped Secondary Particles)

As a result of much research by the inventors, it was learned that a zinc oxide sintered compact tablet having excellent characteristics as described above can be obtained by using a granulated powder having a ratio of donut shaped secondary particles of 50% or more as the sintered compact material. The ratio of the donut shaped secondary particles is preferably 60% or more, and more preferably 68% or more, and optimally 78% or more.

In conventional manufacturing of a typical ceramic, for the reason of promoting a decrease in density, granulated powder that includes many of this kind of donut shaped secondary particles is not used as a sintered compact material. Spherical granulated powder can be obtained using typical spray dryer granulation, however, when the spherical granulated powder is used as a sintered compact material, the orientation of the uniaxially pressed surface of the obtained zinc oxide sintered compact tablet becomes less than 0.48. By making the ratio of donut shaped secondary particles 50% or more, the orientation of the uniaxially pressed surface becomes 0.48 or more, when the ratio is 60% or more, the orientation becomes 0.50 or more, furthermore, when the ratio is 68% or more, the orientation becomes 0.55 or more, and when the ratio is 78% or more, the orientation becomes 0.60 or more.

Donut shaped secondary particles are formed by collecting primary particles into a ring shape, and are obtained by adjusting the water evaporation speed of the slurry in the granulation process using a spray dryer. Moreover, the donut shaped secondary particles referred to here can also be particles in which the thickness of the ring-shaped portion is homogenous, particles in which the thickness of the ring-shaped portion is heterogeneous, or so-called spherical particles with a through hole formed therein. By using this kind of granulated powder, a zinc oxide sintered compact tablet having large (103) crystalline orientation is obtained.

In granulation using a spray dryer, during the process of evaporating the moisture in the sprayed slurry, the particles inside the slurry are attracted to the droplet surface by the droplet surface tension. As a result, in the particle density distribution inside the sprayed slurry, the density of the particles becomes dense on the droplet surface. Donut shaped secondary particles are generated in this way, however, in order to cause this phenomenon, it is necessary to adjust the moisture evaporation speed. In other words, when performing sprayed dryer granulation of zinc oxide, it is necessary to promote the shape of the secondary particles becoming a donut shape by properly selecting conditions such as a proper chamber temperature and airflow.

From the aspect of homogenization of the degree of sintering, the particle size of the donut shaped secondary particles should be within the range of 10 µm to 100 µm. This particle size can be kept within this range by regulating the granulation conditions as will be described later.

(Base Powder)

First, zinc oxide powder, or a mixed powder of zinc oxide and an added element that will be a dopant are prepared as the base powder. First, from the aspect of homogenization of the degree of sintering, the average particle size of the prepared base powder used is preferably 1 µm or less. Moreover, by using a base powder whose particle size (D90) when according to particle size distribution measurement the accumulated mass has reached 90% is no less than 1.0 µm and no greater than 2.0 µm, it is possible to obtain more stable dimensions and density of the obtained sintered compact, and to perform manufacturing with good yield.

(Calcination)

In manufacturing the zinc oxide sintered compact tablet of the present invention, preferably the sintered compact material is a mixture of a calcined powder obtained by calcination of the base powder, and the non-calcined base powder. The mixing method is not particularly limited, and any known technique can be used.

By making part of the base powder a calcined powder, it becomes easy to obtain a sintered compact tablet having a relative density of 50% to 70%. When manufacturing the calcined powder, preferably calcination is performed at 800° C. to 1300° C., and preferably at 900° C. to 1200° C. When the calcination temperature is less than 800° C., the particle growth of the particles hardly advances, so the effect of calcination is not obtained, and when the calcination temperature exceeds 1300° C., zinc volatilizes and shifts from the desired zinc oxide structure, or excessive particle growth occurs during calcination in a post process, so is not desirable. The calcination time is 1 hour to 30 hours, and preferably 10 hours to 20 hours. The amount of calcined powder that is used with respect to the non-calcined power can be arbitrarily set according to the desired relative density of the zinc oxide sintered compact tablet, however, preferably is 30% to 90% by mass.

In the calcination process, calcined powder can be obtained by directly performing calcination of the base powder, however, in a method of obtaining calcined granulated powder by performing calcination after granulation of the base powder, little of the powder after calcination is strongly hardened, so is preferred.

(Granulation)

Next, a slurry is manufactured by mixing the base powder above with pure water, a binding agent such as polyvinyl alcohol, methyl cellulose and the like, and a dispersant such as polycarboxylic acid ammonium salt, acrylic acid-based amine salt and the like such that the concentration of base powder is 50% to 80% by mass, and preferably 65% to 75% by mass, and even more preferably about 70% by mass. The mixing method is not particularly limited and any known technique can be used.

Next, that slurry is sprayed and dried using a spray dryer to obtain granulated powder. In this case, the drying temperature is preferably not less than 80° C. and not more than 100° C. When the drying temperature is less than 80° C., it is not possible to obtain sufficiently dried granulated powder. When drying is not sufficient and the moisture content is high, in the next formation process to the sintering process, there is a high possibility that cracking will occur in the formed body or tablet. When the drying temperature exceeds 100° C., drying of the slurry proceeds rapidly, so secondary particles break down, and it becomes difficult to control the shape of the secondary particles, and thus the ratio of donut shaped secondary particles that are generated becomes low.

Moreover, during granulation, it is necessary to adjust the discharged airflow of the spray dryer. The amount of discharged airflow depends on the spray dryer that is used for performing granulation, so the dryer used must be appropriately adjusted so that the particles in the sprayed slurry inside the chamber are easily arranged in a donut shape.

For example, when a spray dryer (Ohkawara Kakohki Co., Ltd; Model ODL-20) is used, preferably the discharged airflow is 25 m$^3$/min or less, because when the discharged airflow is greater than 25 m$^3$/min, as described above, it becomes difficult to control the shape of the secondary particles, and thus the percentage of donut shaped secondary particles generated becomes low. The lower limit also depends on the dryer used, and it is possible to use the minimum discharge airflow capable by the dryer. By satisfying these conditions, it is possible to manufacture spray dryer granulated power having a percentage of donut shaped secondary particles of 50% or more.

The percentage of donut shaped secondary particles is calculated by observing the obtained granulated powder using an electron microscope, measuring the number of donut shaped particles and the overall number of secondary particles, then using the equation (number of donut shaped secondary particles)/(overall number of secondary particles).

(Formation)

Next, sintered compact material powder composed of granulated powder, is formed for example by axial pressing using a mechanical press that applies pressure in a mold to obtain a compact. In the process for obtaining that compact, when formation is performed by applying pressure to the granulated powder that is no less than 49 MPa (0.5 tonf/cm$^2$) and no greater than 147 MPa (1.5 tonf/cm$^2$), it becomes easy to obtain a sintered compact tablet having the desired relative density, so is preferred. Moreover, by keeping the amount of calcined powder that is used as raw material, the heat treatment temperature of the calcined powder, and the sintering temperature in a later process fixed, it is possible to control the contraction coefficient of the tablets during sintering to be nearly the same.

Therefore, the dimension of the sintered compact tablet can be set by adjusting the compact dimensions in press formation. By making the mold used in press formation such that the edge portion of the inner surface be a C chamfer shape, then when performing C chamfering of the edge portion of the outer surface of the compact, it becomes possible to prevent damage such as splintering when handling the sintered compact tablet that is obtained by sintering the compact, so is preferred.

(Sintering)

Next, by sintering the compact above at normal pressure, a sintered compact tablet composed of zinc oxide or zinc oxide that includes a dopant is obtained. The sintering temperature during this sintering is within the range 800° C. to 1300° C. In this range, as the sintering temperature rises, there is a tendency to obtain a tablet having higher relative density, and lower resistivity. When the sintering temperature is less than 800° C., sintering does not proceed, and a normal pressure sintered compact tablet having weak mechanical strength is obtained. Moreover, because the sintering compaction does not advance sufficiently, dispersion in the density and dimensions of the sintered tablets becomes large. On the other hand, when the sintering temperature exceeds 1300° C., zinc volatilizes and shifts from the desired zinc oxide structure. From this aspect, preferably the sintering temperature is within the range of 900° C. to 1100° C. Moreover, in regards to the rate of temperature rise when performing sintering, considering the vapor pressure during vaporization of the added organic component, the rate is preferable set to 1.0° C./min for the purpose of preventing cracking while the temperature rises.

When sintering atmosphere is at normal pressure, it is possible to use an air, nitrogen gas, argon or oxygen atmosphere. Furthermore, the sintering time is arbitrary depending on the burning conditions such as the calcination furnace, however the time should be set so that the compact is sufficiently sintered, but not excessively sintered. Normally, the time is 10 hours to 20 hours, and preferably 15 hours to 20 hours. When sintering is performed for more than 20 hours, the production cost increases due to the sintering time, and zinc volatilizes.

(Vacuum Reduction)

In the manufacturing process of the present invention, reduction treatment can be performed in a vacuum on the normal pressure sintered compact tablet that was obtained by sintering. In this case, the reduction pressure is taken to be $1 \times 10^{-3}$ Pa or less, and the reduction temperature is taken to within the range 800° C. to 1300° C. As in the case of the sintering conditions, in this range, as the reduction temperature rises, there is a tendency to obtain a tablet with higher relative density and lower resistivity.

Moreover, when doing this, the rate of temperature increase to the reduction temperature above is within the range 1.0° C./min to 10.0° C./min. When performing reduction treatment on a sintered compact, it is not necessary to consider the evaporation of the organic component, however, a rate of temperature increase less than 1.0° C./min invites a drop in productivity, and on the other hand, when the rate of temperature increase is greater than 10.0° C./min, the sintered compact will not be able to withstand the thermal shock, and there is a possibility that cracking will occur and that there will be a drop in yield.

By performing reduction treatment in a vacuum, oxygen deficiency occurs inside the sintered compact tablet, conductivity is given by carrier generation, and it is possible to make the resistivity of the sintered compact tablet $1 \times 10^2$ Ω·cm or less. As a result, the splashing phenomenon hardly occurs during electric discharge when forming a film by the vacuum deposition method, and discharge and sublimation become even more stable. This improves the rate of film formation, so reduction treatment is an effective method for productivity during film formation.

When the reduction temperature is less than 800° C., reduction does not proceed to the inside of the sintered compact tablet, and it is not possible to obtain the sufficient effect of the reduction treatment, and thus the improvement of conductivity of the sintered compact tablet becomes insufficient, so the effect of adding reduction treatment is lost, and conversely has an effect of inviting a decrease in productivity. On the other hand, when the reduction temperature exceeds 1300° C., zinc oxide volatizes on the surface of the sintered compact tablet, and the surface becomes a weak layer with high resistance and productivity is greatly lost. From this aspect, the reduction temperature is preferably within the range of 900° C. to 1100° C.

When the reduction pressure is higher than $1 \times 10^{-3}$ Pa, reduction does not proceed to the inside of the sintered compact tablet, and the conductivity of the sintered compact tablet becomes insufficient. However, when taking into consideration the efficiency and cost of the vacuum processing time, preferably the reduction pressure is $1 \times 10^{-4}$ Pa or more.

The reduction treatment time can be arbitrarily set according to the processing conditions, however a time should be set so that reduction proceeds sufficiently into the sintered compact tablet, and so that it possible to suppress volatilization of zinc. Taking into consideration the efficiency of the reduction treatment and the production cost, normally the time is 1 minute to 1 hour, and preferably 1 minute to 10 minutes.

This reduction treatment is particularly applied when manufacturing a sintered compact tablet that is composed of only zinc oxide, which has high resistance. Moreover, this reduction treatment can also be applied to the manufacturing of a zinc oxide sintered compact tablet having relatively low resistance and that includes a dopant, in order to further lower the resistance.

EXAMPLES

Example 1

First, as the base powder, a specified amount of zinc oxide powder having an average particle size of 1 μm is mixed and prepared.

From the base powder, 60% by mass was separated out, and that power was mixed with pure water, and with polycarboxylic acid ammonium salt as a dispersing agent until the powder concentration became 60% by mass, and a slurry was made inside a mixing tank. That slurry was then sprayed and dried using a spray dryer (Ohkawara Kakohki Co., Ltd; Model ODL-20), to obtain granulated power by a first stage granulation process. With the outlet temperature of the device chamber being 90° C., and the discharged airflow being 15 m³/min, a granulated powder having a particle size of 300 μm or less.

This granulated powder was placed in an atmospheric pressure sintering furnace, and at a temperature of 1000° C., sintering was performed for 20 hours, and after sintering was pulverized to obtain a calcined powder having a particle size of 300 μm or less. That calcined powder was then mixed with the non-calcined base powder that was originally prepared, to obtain a mixed powder of calcined and non-calcined powder.

That mixed powder was then mixed again with pure water, polyvinyl alcohol as an organic binder, and polycarboxylic acid ammonium salt as a dispersing agent until the powder concentration became 70% by mass, and a slurry was made in a mixing tank. That slurry was sprayed and dried using the same spray dryer with the outlet temperature of the device chamber being 90° C. and the discharged airflow being 15 m³/min as a second stage granulation process to obtain a sintered compact material powder composed of granulated powder having a particle size of 300 μm or less. Of the secondary particles of this sintered compact material powder, the percentage of donut shaped secondary particles was 60%.

Next, the sintered compact material powder was placed in a mold of a forming press (Sansho Industry Co., Ltd.; Wave Forming Press), and by axial pressing at a pressure of 90 MPa (0.92 tonf/cm²), 200 cylindrical compacts having a diameter of 30 mm and height of 40 mm were obtained.

Furthermore, the 200 compacts that were obtained were placed in an electric furnace and sintered in air at normal pressure, to obtain 200 normal pressure sintered compact tablets composed of zinc oxide. The sintering temperature was 1000° C., and the sintering time was 20 hours.

The 200 normal pressure sintered compact tablets that were obtained were set inside a graphite container, and in a vacuum having a pressure of $1 \times 10^{-3}$ Pa, were heated at a rate of temperature increase of 5° C./min to a temperature of 1000° C. (maximum attained temperature), and reduction treatment was performed by maintaining the tablets at this temperature for 3 minutes, to obtain 200 zinc oxide sintered compact tablets.

<Testing and Evaluation>

[Relative Density]

The theoretical density of the zinc oxide sintered compact tablet is 5.78 g/cm³, which is the density of zinc oxide. On the other hand, the diameter, height, and weight of the 200 sintered compact tablets that were obtained were measured in order to obtain the bulk density, and from the result of calculating the relative density with respect to the theoretical density, the average value for the relative density was found to be 60%.

[Resistivity]

For 50 samples, a four probe resistivity meter Loresta EP (Mitsubishi Chemical Analytech Co., Ltd, MCP-T360) was used to measure the resistivity on the surface, and the average value of the resistivity was found to be 8.5 Ω·cm.

[X-Ray Diffraction]

Two of the samples were used as test specimens, and X-ray analysis (XRD) measurement using CuKα radiation was performed using an X-ray diffraction apparatus (Spectris Co., Ltd.; X'Pert-PRO/MPD). As a result, the integrated intensities of surface (103) and surface (110) that were obtained were taken to be $I_{(103)}$ and $I_{(110)}$, and the orientation of the uniaxially pressed surface that is expressed as $I_{(103)}/(I_{(103)}+I_{(110)})$ was calculated and found to be 0.513.

For the X-ray diffraction peak that was obtained from the zinc oxide sintered compact tablet of this example, and focusing on the diffraction mentioned for the zinc oxide sintered compact tablets described in JP 06-88218 (A), JP 06-340468 (A) and JP 2002-121067 (A), a comparison was made of the crystalline orientation. The characteristic of the crystalline orientation of this example did not correspond to the characteristic disclosed in JP 06-88218 (A), and the (002) crystalline orientation was less than the (101) crystalline orientation in this example. Moreover, in investigating the crystalline orientation expressed by $I_{(101)}/(I_{(100)}+I_{(002)}+I_{(101)})$ as disclosed in JP 06-340468 (A) for this example, the crystalline orientation of this example was 0.5 and did not correspond to 0.55 or more that is characteristic of the sintered compact disclosed in JP 06-340468 (A). Furthermore, in investigating the crystalline orientation expressed by $I_{(110)}/(I_{(110)}+I_{(002)}+I_{(101)})$ in JP 2002-121067 (A) for this example, the crystalline orientation of this example was 0.2 and did not correspond to 0.24 or more that is characteristic of the sintered compact disclosed in JP 2002-121067. In this way, there was no correspondence with the diffraction peaks mentioned in JP 06-88218 (A), JP 06-340468 (A) and JP 2002-121067 (A), and when the (103) crystalline orientation is increased according to the knowledge of the present invention, it was confirmed that the splashing phenomenon did not occur during film formation, and a zinc oxide sintered compact tablet having high productivity was obtained.

[Vapor Deposition Test]

50 samples were continuously supplied to a vacuum deposition apparatus, an electron beam was irradiated onto the samples, and vapor deposition was performed. As a result, it was found that the splashing phenomenon did not occur during film formation in any of the sintered compact tablets, and electric discharge was stable.

The manufacturing conditions of example 1 are given in Table 1, and the results of investigation and testing (evaluation) are given in Table 2.

Example 2

In the second stage granulation process, except for making granulated powder with the outlet temperature of the chamber being 80° C., and the discharge airflow being 15 m³/min, a sintered compact material powder composed of granulated powder was obtained in the same was as in Example 1. Of the secondary particles of this sintered compact material, the percentage of the number of donut shaped secondary particles was 72%. The obtained sintered compact material was used to manufacture zinc oxide sintered compact tablets with the processing from formation on being the performed under the same conditions as in Example 1.

The same testing as performed in Example 1 was performed for the obtained zinc oxide sintered compact tablets, and it was found that the average value of the relative density was 60% and the average value of the resistivity was 5.7 Ω·cm.

Moreover, orientation was calculated in the same way as was performed in Example 1 for the obtained zinc oxide sintered compact tablets and found to be 0.578.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 2 are given in Table 1, and the results of investigation and testing (evaluation) are given in Table 2.

Example 3

In the second stage granulation process, except for making granulated powder with the outlet temperature of the chamber being 90° C., and the discharge airflow being 5 m³/min, a sintered compact material powder composed of granulated powder was obtained in the same was as in Example 1. Of the secondary particles of this sintered compact material, the percentage of the number of donut shaped secondary particles was 68%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 61% and the average value of the resistivity was 6.2 Ω·cm.

Moreover, orientation was calculated in the same way as was performed in Example 1 for the obtained zinc oxide sintered compact tablets and found to be 0.551.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of example 3 are given in Table 1, and the results of investigation and testing (evaluation) are given in Table 2.

Example 4

In the second stage granulation process, except for making granulated powder with the outlet temperature of the chamber being 80° C., and the discharge airflow being 5 m³/min, a sintered compact material powder composed of granulated powder was obtained in the same was as in Example 1. Of the secondary particles of this sintered compact material, the percentage of the number of donut shaped secondary particles was 79%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 61% and the average value of the resistivity was 5.5 Ω·cm.

Moreover, orientation was calculated in the same way as was performed in Example 1 for the obtained zinc oxide sintered compact tablets and found to be 0.605.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 4 are given in Table 1, and the results of investigation and testing (evaluation) are given in Table 2.

Example 5

In the second stage granulation process, except for making granulated powder with the outlet temperature of the chamber being 100° C., and the discharge airflow being 15 m³/min, a sintered compact material powder composed of granulated powder was obtained in the same was as in Example 1. Of the secondary particles of this sintered compact material, the percentage of the number of donut shaped secondary particles was 54%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 60% and the average value of the resistivity was 6.1 Ω·cm.

Moreover, orientation was calculated in the same way as was performed in Example 1 for the obtained zinc oxide sintered compact tablets and found to be 0.490.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 5 are given in Table 1, and the results of investigation and testing (evaluation) are given in Table 2.

Example 6

In the second stage granulation process, except for making granulated powder with the outlet temperature of the chamber being 90° C., and the discharge airflow being 25 m³/min, a sintered compact material powder composed of granulated powder was obtained in the same was as in Example 1. Of the secondary particles of this sintered compact material, the percentage of the number of donut shaped secondary particles was 55%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 60% and the average value of the resistivity was 6.5 Ω·cm.

Moreover, orientation was calculated in the same way as was performed in Example 1 for the obtained zinc oxide sintered compact tablets and found to be 0.496.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 6 are given in Table 1, and the results of investigation and testing (evaluation) are given in Table 2.

Example 7

In the second stage granulation process, except for making granulated powder with the outlet temperature of the chamber being 100° C., and the discharge airflow being 25 m³/min, a sintered compact material powder composed of granulated powder was obtained in the same was as in Example 1. Of the secondary particles of this sintered compact material, the percentage of the number of donut shaped secondary particles was 51%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 60% and the average value of the resistivity was 6.2 Ω·cm.

Moreover, orientation was calculated in the same way as was performed in Example 1 for the obtained zinc oxide sintered compact tablets and found to be 0.487.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 7 are given in Table 1, and the results of investigation and testing (evaluation) are given in Table 2.

Example 8

Except for changing the sintering temperature to 800° C., zinc oxide sintered compact tablets were manufactured under the same conditions as in Example 1.

The same testing as was performed in Example 1 was performed for the obtained zinc oxide sintered compact tablets, and it was found that the average value of the relative density was 59% and the average value of the resistivity was 1.2×10 Ω·cm.

Moreover, orientation was calculated in the same way as was performed in Example 1 for the obtained zinc oxide sintered compact tablets and found to be 0.506.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 8 are given in Table 1, and the results of investigation and testing (evaluation) are given in Table 2.

Example 9

Except for changing the sintering temperature to 1300° C., zinc oxide sintered compact tablets were manufactured under the same conditions as in Example 1.

The same testing as was performed in Example 1 was performed for the obtained zinc oxide sintered compact tablets, and it was found that the average value of the relative density was 62% and the average value of the resistivity was 6.3 Ω·cm.

Moreover, orientation was calculated in the same way as was performed in Example 1 for the obtained zinc oxide sintered compact tablets and found to be 0.516.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 9 are given in Table 1, and the results of investigation and testing (evaluation) are given in Table 2.

Example 10

Except for changing the reduction treatment temperature (maximum attained temperature) to 800° C., zinc oxide sintered compact tablets were manufactured under the same conditions as in Example 1.

The same testing as was performed in Example 1 was performed for the obtained zinc oxide sintered compact tablets, and it was found that the average value of the relative density was 59% and the average value of the resistivity was 2.5×10 Ω·cm.

Moreover, orientation was calculated in the same way as was performed in Example 1 for the obtained zinc oxide sintered compact tablets and found to be 0.505.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 10 are given in Table 1, and the results of investigation and testing (evaluation) are given in Table 2.

Example 11

Except for changing the reduction treatment temperature (maximum attained temperature) to 1300° C., zinc oxide sintered compact tablets were manufactured under the same conditions as in Example 1.

The same testing as was performed in Example 1 was performed for the obtained zinc oxide sintered compact tablets, and it was found that the average value of the relative density was 61% and the average value of the resistivity was 6.0 Ω·cm.

Moreover, orientation was calculated in the same way as was performed in Example 1 for the obtained zinc oxide sintered compact tablets and found to be 0.511.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 11 are given in Table 1, and the results of investigation and testing (evaluation) are given in Table 2.

Example 12

Except for the point that reduction treatment was not performed, zinc oxide sintered compact tablets were manufactured under the same conditions as in Example 1.

The same testing as was performed in Example 1 was performed for the obtained zinc oxide sintered compact tablets, and it was found that the average value of the relative density was 60% and the average value of the resistivity was 3.2×10⁵ Ω·cm.

Moreover, orientation was calculated in the same way as was performed in Example 1 for the obtained zinc oxide sintered compact tablets and found to be 0.510.

Furthermore, vapor evaporation testing was performed for the obtained zinc oxide sintered compact tablets, and it was found that there were no defects or cracking, the splashing phenomenon did not occur in any of the tablets, and electric discharge was stable.

The manufacturing conditions of Example 12 are given in Table 1, and the results of investigation and testing (evaluation) are given in Table 2.

Comparative Example 1

In the second stage granulation process, except for making granulated powder with the outlet temperature of the chamber being 110° C., and the discharge airflow being 15 m³/min, a sintered compact material powder composed of granulated powder was obtained in the same was as in Example 1. Of the secondary particles of this sintered compact material, the percentage of the number of donut shaped secondary particles was 25%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 61% and the average value of the resistivity was 7.5 Ω·cm.

Moreover, orientation was calculated in the same way as was performed in Example 1 for the obtained zinc oxide sintered compact tablets and found to be 0.462.

Furthermore, vapor evaporation testing was performed for the obtained zinc oxide sintered compact tablets, and it was found that the splashing phenomenon occurred, and electric discharge was unstable.

The manufacturing conditions of Comparative Example 1 are given in Table 1, and the results of investigation and testing (evaluation) are given in Table 2.

Comparative Example 2

In the second stage granulation process, except for making granulated powder with the outlet temperature of the chamber being 70° C., and the discharge airflow being 15 m³/min, a sintered compact material powder composed of granulated powder was obtained in the same was as in Example 1. Of the secondary particles of this sintered compact material, the percentage of the number of donut shaped secondary particles was 53%, however, a sufficiently dried sintered compact material powder could not be obtained, and because the moisture content was high, cracking occurred in 84 of the 200 compacts that were obtained in the formation process. Therefore, it was determined that under these condition, productivity has become very poor, so manufacturing was stopped.

The manufacturing conditions of Comparative Example 2 are given in Table 1, and the results of investigation and testing (evaluation) are given in Table 2.

Comparative Example 3

In the second stage granulation process, except for making granulated powder with the outlet temperature of the chamber being 90° C., and the discharge airflow being 28 m³/min, a sintered compact material powder composed of granulated powder was obtained in the same was as in Example 1. Of the secondary particles of this sintered compact material, the percentage of the number of donut shaped secondary particles was 42%. The obtained sintered compact material was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 60% and the average value of the resistivity was 7.4 Ω·cm.

Moreover, orientation was calculated in the same way as was performed in Example 1 for the obtained zinc oxide sintered compact tablets and found to be 0.471.

Furthermore, vapor evaporation testing was performed for the obtained zinc oxide sintered compact tablets, and it was found that the splashing phenomenon occurred, and electric discharge was unstable.

The manufacturing conditions of Comparative Example 3 are given in Table 1, and the results of investigation and testing (evaluation) are given in Table 2.

Comparative Example 4

Zinc oxide powder, having a maximum particle size of 75 μm or less and an average particle size of 10 μm and calcined at approximately 1400° C. for 3 hours, was mixed at 65% by mass with non-calcined zinc oxide powder, having a maximum particles size of 20 μm or less and an average particle size of 1 μm, at 35% by mass, and these were dry mixed in a ball mill. Of the secondary particles of the obtained mixed powder, the percentage of the number of donut shaped secondary particles was 0%. Sintered compact material that was composed of this mixed powder was used to manufacture zinc oxide sintered compact tablets with the processing from formation on being the performed under the same conditions as in Example 1.

The same testing as was performed in Example 1 was performed for the obtained zinc oxide sintered compact tablets, and it was found that the average value of the relative density was 60% and the average value of the resistivity was 9.1 Ω·cm.

Moreover, orientation was calculated in the same way as was performed in Example 1 for the obtained zinc oxide sintered compact tablets and found to be 0.475.

Furthermore, vapor evaporation testing was performed for the obtained zinc oxide sintered compact tablets, and it was found that the splashing phenomenon occurred, and electric discharge was unstable.

The manufacturing conditions of Comparative Example 4 are given in Table 1, and the results of investigation and testing (evaluation) are given in Table 2.

Comparative Example 5

Zinc oxide powder, having a maximum particle size of 110 μm or less and an average particle size of 5 μm and calcined at approximately 900° C. for 3 hours, was mixed was used as a sintered compact material powder, and all processing from formation on was performed under the same conditions as in Example 1 to manufacture zinc oxide sintered compact tablets. Of the secondary particles of the sintered compact material powder that was used, the percentage of the number of donut shaped secondary particles was 0%. The same testing as was performed in Example 1 was performed for the obtained zinc oxide sintered compact tablets, and it was found that the average value of the relative density was 60% and the average value of the resistivity was 8.8 Ω·cm.

Moreover, orientation was calculated in the same way as was performed in Example 1 for the obtained zinc oxide sintered compact tablets and found to be 0.472.

Furthermore, vapor evaporation testing was performed for the obtained zinc oxide sintered compact tablets, and it was found that the splashing phenomenon occurred, and electric discharge was unstable.

The manufacturing conditions of Comparative Example 5 are given in Table 1, and the results of investigation and testing (evaluation) are given in Table 2.

TABLE 1

|  | Granulation Conditions | | Sintering Conditions | | | Reduction Conditions | | | |
| --- | --- | --- | --- | --- | --- | --- | --- | --- | --- |
|  | Granulation temperature (°C.) | Discharge airflow (m³/min) | Sintering atmosphere | Sintering temperature (°C.) | Sintering time (h) | Vacuum pressure (Pa) | Rate of temperature rise (°C./min) | Processing temperature (°C.) | Processing time (min) |
| Example 1 | 90 | 15 | Air atmosphere | 1000 | 20 | 1 × 10⁻³ | 5 | 1000 | 3 |
| Example 2 | 80 | 15 | Air atmosphere | 1000 | 20 | 1 × 10⁻³ | 5 | 1000 | 3 |
| Example 3 | 90 | 5 | Air atmosphere | 1000 | 20 | 1 × 10⁻³ | 5 | 1000 | 3 |
| Example 4 | 80 | 5 | Air atmosphere | 1000 | 20 | 1 × 10⁻³ | 5 | 1000 | 3 |
| Example 5 | 100 | 15 | Air atmosphere | 1000 | 20 | 1 × 10⁻³ | 5 | 1000 | 3 |
| Example 6 | 90 | 25 | Air atmosphere | 1000 | 20 | 1 × 10⁻³ | 5 | 1000 | 3 |
| Example 7 | 100 | 25 | Air atmosphere | 1000 | 20 | 1 × 10⁻³ | 5 | 1000 | 3 |
| Example 8 | 90 | 15 | Air atmosphere | 800 | 20 | 1 × 10⁻³ | 5 | 1000 | 3 |
| Example 9 | 90 | 15 | Air atmosphere | 1300 | 20 | 1 × 10⁻³ | 5 | 1000 | 3 |
| Example 10 | 90 | 15 | Air atmosphere | 1000 | 20 | 1 × 10⁻³ | 5 | 800 | 3 |
| Example 11 | 90 | 15 | Air atmosphere | 1000 | 20 | 1 × 10⁻³ | 5 | 1300 | 3 |
| Example 12 | 90 | 15 | Air atmosphere | 1000 | 20 | — | — | — | — |
| Comparative Example 1 | 110 | 15 | Air atmosphere | 1000 | 20 | 1 × 10⁻³ | 5 | 1000 | 3 |
| Comparative Example 2 | 70 | 15 | — | — | — | — | — | — | — |
| Comparative Example 3 | 90 | 28 | Air atmosphere | 1000 | 20 | 1 × 10⁻³ | 5 | 1000 | 3 |
| Comparative Example 4 | — | — | Air atmosphere | 1000 | 20 | 1 × 10⁻³ | 5 | 1000 | 3 |
| Comparative Example 5 | — | — | Air atmosphere | 1000 | 20 | 1 × 10⁻³ | 5 | 1000 | 3 |

Note)
Ex: Example; CEx: Comparative Example

TABLE 2

| | Donut shaped secondary particles (%) | Relative density (%) | Resistivity (Ω·cm) | Orientation | Splash occurrence |
| --- | --- | --- | --- | --- | --- |
| Example 1 | 60 | 60 | 8.5 | 0.513 | No splash |
| Example 2 | 72 | 60 | 5.7 | 0.578 | No splash |
| Example 3 | 68 | 61 | 6.2 | 0.551 | No splash |
| Example 4 | 79 | 61 | 5.5 | 0.605 | No splash |
| Example 5 | 54 | 60 | 6.1 | 0.490 | No splash |
| Example 6 | 55 | 60 | 6.5 | 0.496 | No splash |
| Example 7 | 51 | 60 | 6.2 | 0.487 | No splash |
| Example 8 | 60 | 59 | 12 | 0.506 | No splash |
| Example 9 | 60 | 62 | 6.3 | 0.516 | No splash |
| Example 10 | 60 | 59 | 25 | 0.505 | No splash |
| Example 11 | 60 | 61 | 6.0 | 0.511 | No splash |
| Example 12 | 60 | 60 | 3.2 × 10⁵ | 0.510 | No splash |
| Comparative Example 1 | 25 | 61 | 7.5 | 0.462 | Splash |
| Comparative Example 2 | 53 | — | — | — | — |
| Comparative Example 3 | 42 | 60 | 7.4 | 0.471 | Splash |

TABLE 2-continued

|  | Donut shaped secondary particles (%) | Relative density (%) | Resistivity (Ω·cm) | Orientation | Splash occurrence |
|---|---|---|---|---|---|
| Comparative Example 4 | 0 | 60 | 9.1 | 0.475 | Splash |
| Comparative Example 5 | 0 | 60 | 8.8 | 0.472 | Splash |

Note)
Ex: Example; CEx: Comparative Example

Examples 13 to 15

The base powder is prepared by mixing zinc oxide powder, having an average particle size of 1 μm or less, and gallium oxide powder, having an average particle size of 2 μm or less, at specified amounts so that the ratio becomes "zinc:gallium=97 atomic %:3.0 atomic %" (Example 13), "zinc:gallium=90 atomic %:10.0 atomic %" (Example 14), "zinc:gallium=50 atomic %:50.0 atomic %" (Example 15).

From this, zinc oxide powder and gallium oxide powder are dispensed at 60% by mass at time, to obtain a granulated powder in the same way as in the first stage granulation process in Example 1.

The granulated powder is put into a sintering furnace at atmospheric pressure and sintered at 1200° C. for 20 hours, then after sintering, was pulverized to obtain a calcined powder having a particle size of 300 μm or less.

Then that calcined powder is mixed with the non-calcined base powder that was prepared at first to obtain a mixed powder of calcined and non-calcined powder, after which as in the second stage granulation process of the first Example, a sintered compact material powder composed of granulated powder having a particle size of 300 μm was obtained. Of the secondary particles of this sintered compact material powder, the percentage of the number of donut shaped secondary particles was 60% (Example 13), 57% (Example 14) and 52% (Example 15).

Using the obtained sintered compact material, processing from formation on, except for using a sintering temperature and reduction treatment temperature of 1100° C., a zinc oxide sintered compact tablet was manufactured under the same conditions as in Example 1.

Here, the amounts of gallium oxide in the zinc oxide sintered compact tablets that include gallium oxide were respectively 3.2% by mass (Example 13), 10.7% by mass (Example 14) and 51.9% by mass (Example 15), so, because the respective densities of zinc oxide and gallium oxide are 5.78 g/cm$^3$ and 6.16 g/cm$^3$, the theoretical density of the sintered compact tablet was 5.79 g/cm$^3$ (Example 13), 5.82 g/cm$^3$ (Example 14) and 5.97 g/cm$^3$ (Example 15). The obtained sintered compact tablets were tested as in Example 1, and the average values of the relative density were 60% in each case, and the average values of the resistivity were 6.6×10$^{-4}$ Ω·cm (Example 13), 8.9×10$^{-4}$ Ω·cm (Example 14) and 3.1×10$^{-4}$ Ω·cm (Example 15).

Moreover, orientation of the uniaxially pressed surface was calculated in the same way as was performed in Example 1 for the obtained zinc oxide sintered compact tablets and found to be 0.498 (Example 13), 0.495 (Example 14) and 0.492 (Example 15).

Furthermore, vapor evaporation testing was performed for the obtained zinc oxide sintered compact tablets, and it was found that in Examples 13 to 15 there were no defects or cracking, the splashing phenomenon did not occur, and electric discharge was stable.

The manufacturing conditions of Examples 13 to 15 are given in Table 3, and the results of investigation and testing (evaluation) are given in Table 4.

Example 16

Except that instead of gallium oxide, boron oxide powder was used in the base powder, the zinc oxide sintered compact tablets were manufactured under the same conditions as in Example 13. Of the secondary particles of the sintered compact material powder, the percentage of the number of donut shaped secondary particles was 59%, and the average value of the relative density that was calculated from the theoretical density that was calculated in the same was as in Example 13 for the obtained sintered compact and the test results was 60%, and the average value of the resistivity was 6.8×10$^{-3}$ Ω·cm. Moreover, the orientation of the obtained sintered compact tablets that was calculated in the same way as in Example 1 was found to be 0.508.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 16 are given in Table 3, and the results of investigation and testing (evaluation) are given in Table 4.

Example 17

Except that instead of gallium oxide, aluminum oxide powder was used in the base powder, the zinc oxide sintered compact tablets were manufactured under the same conditions as in Example 13. Of the secondary particles of the sintered compact material powder, the percentage of the number of donut shaped secondary particles was 61%, and the average value of the relative density that was calculated from the theoretical density that was calculated in the same was as in Example 13 for the obtained sintered compact and the test results was 60%, and the average value of the resistivity was 3.1×10$^{-3}$ Ω·cm. Moreover, the orientation of the obtained sintered compact tablets that was calculated in the same way as in Example 1 was found to be 0.510.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 17 are given in Table 3, and the results of investigation and testing (evaluation) are given in Table 4.

Example 18

Except that instead of gallium oxide, indium oxide powder was used in the base powder, the zinc oxide sintered compact tablets were manufactured under the same conditions as in Example 13. Of the secondary particles of the sintered compact material powder, the percentage of the number of donut shaped secondary particles was 58%, and the average value of the relative density that was calculated from the theoretical density that was calculated in the same was as in Example 13 for the obtained sintered compact and the test results was 60%, and the average value of the resistivity was 4.1×10$^{-3}$ Ω·cm. Moreover, the orientation of the obtained sintered compact tablets that was calculated in the same way as in Example 1 was found to be 0.501.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 18 are given in Table 3, and the results of investigation and testing (evaluation) are given in Table 4.

Example 19

Except that instead of gallium oxide, titanium oxide powder was used in the base powder, the zinc oxide sintered compact tablets were manufactured under the same conditions as in Example 13. Of the secondary particles of the sintered compact material powder, the percentage of the number of donut shaped secondary particles was 58%, and the average value of the relative density that was calculated from the theoretical density that was calculated in the same was as in Example 13 for the obtained sintered compact and the test results was 60%, and the average value of the resistivity was $1.2 \times 10^{-3}$ Ω·cm. Moreover, the orientation of the obtained sintered compact tablets that was calculated in the same way as in Example 1 was found to be 0.508.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 19 are given in Table 3, and the results of investigation and testing (evaluation) are given in Table 4.

Example 20

Except that instead of gallium oxide, zirconium oxide powder was used in the base powder, the zinc oxide sintered compact tablets were manufactured under the same conditions as in Example 13. Of the secondary particles of the sintered compact material powder, the percentage of the number of donut shaped secondary particles was 57%, and the average value of the relative density that was calculated from the theoretical density that was calculated in the same was as in Example 13 for the obtained sintered compact and the test results was 59%, and the average value of the resistivity was $4.5 \times 10^{-2}$ Ω·cm. Moreover, the orientation of the obtained sintered compact tablets that was calculated in the same way as in Example 1 was found to be 0.492.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 20 are given in Table 3, and the results of investigation and testing (evaluation) are given in Table 4.

Example 21

Except that instead of gallium oxide, hafnium oxide powder was used in the base powder, the zinc oxide sintered compact tablets were manufactured under the same conditions as in Example 13. Of the secondary particles of the sintered compact material powder, the percentage of the number of donut shaped secondary particles was 59%, and the average value of the relative density that was calculated from the theoretical density that was calculated in the same was as in Example 13 for the obtained sintered compact and the test results was 59%, and the average value of the resistivity was $7.2 \times 10^{-2}$ Ω·cm. Moreover, the orientation of the obtained sintered compact tablets that was calculated in the same way as in Example 1 was found to be 0.500.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 21 are given in Table 3, and the results of investigation and testing (evaluation) are given in Table 4.

Example 22

Except that instead of gallium oxide, molybdenum oxide powder was used in the base powder, the zinc oxide sintered compact tablets were manufactured under the same conditions as in Example 13. Of the secondary particles of the sintered compact material powder, the percentage of the number of donut shaped secondary particles was 61%, and the average value of the relative density that was calculated from the theoretical density that was calculated in the same was as in Example 13 for the obtained sintered compact and the test results was 61%, and the average value of the resistivity was $2.2 \times 10^{-3}$ Ω·cm. Moreover, the orientation of the obtained sintered compact tablets that was calculated in the same way as in Example 1 was found to be 0.498.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 22 are given in Table 3, and the results of investigation and testing (evaluation) are given in Table 4.

Example 23

Except that instead of gallium oxide, tungsten oxide powder was used in the base powder, the zinc oxide sintered compact tablets were manufactured under the same conditions as in Example 13. Of the secondary particles of the sintered compact material powder, the percentage of the number of donut shaped secondary particles was 60%, and the average value of the relative density that was calculated from the theoretical density that was calculated in the same was as in Example 13 for the obtained sintered compact and the test results was 60%, and the average value of the resistivity was $9.4 \times 10^{-4}$ Ω·cm. Moreover, the orientation of the obtained sintered compact tablets that was calculated in the same way as in Example 1 was found to be 0.510.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 23 are given in Table 3, and the results of investigation and testing (evaluation) are given in Table 4.

Example 24

Except that instead of gallium oxide, vanadium oxide powder was used in the base powder, the zinc oxide sintered compact tablets were manufactured under the same conditions as in Example 13. Of the secondary particles of the sintered compact material powder, the percentage of the number of donut shaped secondary particles was 56%, and the average value of the relative density that was calculated from the theoretical density that was calculated in the same was as in Example 13 for the obtained sintered compact and the test results was 60%, and the average value of the resistivity was $8.6 \times 10^{-2}$ Ω·cm. Moreover, the orientation of the obtained sintered compact tablets that was calculated in the same way as in Example 1 was found to be 0.505.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 24 are given in Table 3, and the results of investigation and testing (evaluation) are given in Table 4.

Example 25

Except that instead of gallium oxide, niobium oxide powder was used in the base powder, the zinc oxide sintered compact tablets were manufactured under the same conditions as in Example 13. Of the secondary particles of the sintered compact material powder, the percentage of the number of donut shaped secondary particles was 60%, and the average value of the relative density that was calculated from the theoretical density that was calculated in the same was as in Example 13 for the obtained sintered compact and the test results was 62%, and the average value of the resistivity was $8.1 \times 10^{-2}$ Ω·cm. Moreover, the orientation of the obtained sintered compact tablets that was calculated in the same way as in Example 1 was found to be 0.511.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 25 are given in Table 3, and the results of investigation and testing (evaluation) are given in Table 4.

Example 26

Except that instead of gallium oxide, tantalum oxide powder was used in the base powder, the zinc oxide sintered compact tablets were manufactured under the same conditions as in Example 13. Of the secondary particles of the sintered compact material powder, the percentage of the number of donut shaped secondary particles was 59%, and the average value of the relative density that was calculated from the theoretical density that was calculated in the same was as in Example 13 for the obtained sintered compact and the test results was 60%, and the average value of the resistivity was $3.5 \times 10^{-3}$ Ω·cm. Moreover, the orientation of the obtained sintered compact tablets that was calculated in the same way as in Example 1 was found to be 0.504.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 26 are given in Table 3, and the results of investigation and testing (evaluation) are given in Table 4.

Example 27

Except that instead of gallium oxide, cerium oxide powder was used in the base powder, the zinc oxide sintered compact tablets were manufactured under the same conditions as in Example 13. Of the secondary particles of the sintered compact material powder, the percentage of the number of donut shaped secondary particles was 58%, and the average value of the relative density that was calculated from the theoretical density that was calculated in the same was as in Example 13 for the obtained sintered compact and the test results was 59%, and the average value of the resistivity was $6.9 \times 10^{-2}$ Ω·cm. Moreover, the orientation of the obtained sintered compact tablets that was calculated in the same way as in Example 1 was found to be 0.497.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 27 are given in Table 3, and the results of investigation and testing (evaluation) are given in Table 4.

Example 28

Except that instead of gallium oxide, praseodymium oxide powder was used in the base powder, the zinc oxide sintered compact tablets were manufactured under the same conditions as in Example 13. Of the secondary particles of the sintered compact material powder, the percentage of the number of donut shaped secondary particles was 59%, and the average value of the relative density that was calculated from the theoretical density that was calculated in the same was as in Example 13 for the obtained sintered compact and the test results was 60%, and the average value of the resistivity was $1.0 \times 10^{-1}$ Ω·cm. Moreover, the orientation of the obtained sintered compact tablets that was calculated in the same way as in Example 1 was found to be 0.511.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 28 are given in Table 3, and the results of investigation and testing (evaluation) are given in Table 4.

Example 29

Except that instead of gallium oxide, gadolinium oxide powder was used in the base powder, the zinc oxide sintered compact tablets were manufactured under the same conditions as in Example 13. Of the secondary particles of the sintered compact material powder, the percentage of the number of donut shaped secondary particles was 62%, and the average value of the relative density that was calculated from the theoretical density that was calculated in the same was as in Example 13 for the obtained sintered compact and the test results was 60%, and the average value of the resistivity was $2.0 \times 10^{-1}$ Ω·cm. Moreover, the orientation of the obtained sintered compact tablets that was calculated in the same way as in Example 1 was found to be 0.502.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 29 are given in Table 3, and the results of investigation and testing (evaluation) are given in Table 4.

Example 30

Except that instead of gallium oxide, yttrium oxide powder was used in the base powder, the zinc oxide sintered compact tablets were manufactured under the same conditions as in Example 13. Of the secondary particles of the sintered compact material powder, the percentage of the number of donut shaped secondary particles was 59%, and the average value of the relative density that was calculated from the theoretical density that was calculated in the same was as in Example 13 for the obtained sintered compact and the test results was 58%, and the average value of the resistivity was $9.2 \times 10^{-2}$ Ω·cm. Moreover, the orientation of the obtained sintered compact tablets that was calculated in the same way as in Example 1 was found to be 0.502.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 30 are given in Table 3, and the results of investigation and testing (evaluation) are given in Table 4.

Example 31

Except that instead of gallium oxide, tin oxide powder was used in the base powder, the zinc oxide sintered compact tablets were manufactured under the same conditions as in Example 13. Of the secondary particles of the sintered compact material powder, the percentage of the number of donut shaped secondary particles was 60%, and the average value of the relative density that was calculated from the theoretical density that was calculated in the same was as in Example 13 for the obtained sintered compact and the test results was 59%, and the average value of the resistivity was $2.1 \times 10^{-2}$ Ω·cm. Moreover, the orientation of the obtained sintered compact tablets that was calculated in the same way as in Example 1 was found to be 0.508.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 31 are given in Table 3, and the results of investigation and testing (evaluation) are given in Table 4.

Example 32

Except that instead of gallium oxide, ruthenium oxide powder was used in the base powder, the zinc oxide sintered compact tablets were manufactured under the same conditions as in Example 13. Of the secondary particles of the sintered compact material powder, the percentage of the number of donut shaped secondary particles was 59%, and the average value of the relative density that was calculated from the theoretical density that was calculated in the same was as in Example 13 for the obtained sintered compact and the test results was 60%, and the average value of the resistivity was $5.0 \times 10^{-2}$ Ω·cm. Moreover, the orientation of the obtained sintered compact tablets that was calculated in the same way as in Example 1 was found to be 0.509.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 32 are given in Table 3, and the results of investigation and testing (evaluation) are given in Table 4.

Example 33

Except that instead of gallium oxide, magnesium oxide powder was used in the base powder, the zinc oxide sintered compact tablets were manufactured under the same conditions as in Example 13. Of the secondary particles of the sintered compact material powder, the percentage of the number of donut shaped secondary particles was 63%, and the average value of the relative density that was calculated from the theoretical density that was calculated in the same was as in Example 13 for the obtained sintered compact and the test results was 62%, and the average value of the resistivity was $2.8 \times 10^{-3}$ Ω·cm. Moreover, the orientation of the obtained sintered compact tablets that was calculated in the same way as in Example 1 was found to be 0.501.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 33 are given in Table 3, and the results of investigation and testing (evaluation) are given in Table 4.

Example 34

Except that instead of gallium oxide, iridium oxide powder was used in the base powder, the zinc oxide sintered compact tablets were manufactured under the same conditions as in Example 13. Of the secondary particles of the sintered compact material powder, the percentage of the number of donut shaped secondary particles was 60%, and the average value of the relative density that was calculated from the theoretical density that was calculated in the same was as in Example 13 for the obtained sintered compact and the test results was 60%, and the average value of the resistivity was $8.8 \times 10^{-2}$ Ω·cm. Moreover, the orientation of the obtained sintered compact tablets that was calculated in the same way as in Example 1 was found to be 0.510.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 34 are given in Table 3, and the results of investigation and testing (evaluation) are given in Table 4.

Example 35

Except that instead of gallium oxide, bismuth oxide powder was used in the base powder, the zinc oxide sintered compact tablets were manufactured under the same conditions as in Example 13. Of the secondary particles of the sintered compact material powder, the percentage of the number of donut shaped secondary particles was 56%, and the average value of the relative density that was calculated from the theoretical density that was calculated in the same was as in Example 13 for the obtained sintered compact and the test results was 58%, and the average value of the resistivity was $2.2 \times 10^{-1}$ Ω·cm. Moreover, the orientation of the obtained sintered compact tablets that was calculated in the same way as in Example 1 was found to be 0.503.

When vapor evaporation testing was performed for the obtained zinc oxide sintered compact tablets in the same way as in Example 1, it was found that were no defects or cracking, the splashing phenomenon did not occur, and this result displayed a good effect for film formation.

The manufacturing conditions of Example 35 are given in Table 3, and the results of investigation and testing (evaluation) are given in Table 4.

TABLE 3

| | | Dopant amount (atomic %) | Granulation Conditions | | Sintering Conditions | | | Reduction Conditions | | | |
| | | | | | | | | | Rate of | | |
| | Dopant | | Granulation temperature (° C.) | Discharge airflow (m³/min) | Sintering atmosphere | Sintering temperature (° C.) | Sintering time (h) | Vacuum pressure (Pa) | temperature rise (° C./min) | Processing temperature (° C.) | Processing time (min) |
| --- | --- | --- | --- | --- | --- | --- | --- | --- | --- | --- | --- |
| Example 13 | Ga | 3 | 90 | 15 | Air atmosphere | 1100 | 20 | $1 \times 10^{-3}$ | 5 | 1100 | 3 |
| Example 14 | Ga | 10 | 90 | 15 | Air atmosphere | 1100 | 20 | $1 \times 10^{-3}$ | 5 | 1100 | 3 |
| Example 15 | Ga | 50 | 90 | 15 | Air atmosphere | 1100 | 20 | $1 \times 10^{-3}$ | 5 | 1100 | 3 |
| Example 16 | B | 3 | 90 | 15 | Air atmosphere | 1100 | 20 | $1 \times 10^{-3}$ | 5 | 1100 | 3 |
| Example 17 | Al | 3 | 90 | 15 | Air atmosphere | 1100 | 20 | $1 \times 10^{-3}$ | 5 | 1100 | 3 |
| Example 18 | In | 3 | 90 | 15 | Air atmosphere | 1100 | 20 | $1 \times 10^{-3}$ | 5 | 1100 | 3 |
| Example 19 | Ti | 3 | 90 | 15 | Air atmosphere | 1100 | 20 | $1 \times 10^{-3}$ | 5 | 1100 | 3 |
| Example 20 | Zr | 3 | 90 | 15 | Air atmosphere | 1100 | 20 | $1 \times 10^{-3}$ | 5 | 1100 | 3 |
| Example 21 | Hf | 3 | 90 | 15 | Air atmosphere | 1100 | 20 | $1 \times 10^{-3}$ | 5 | 1100 | 3 |
| Example 22 | Mo | 3 | 90 | 15 | Air atmosphere | 1100 | 20 | $1 \times 10^{-3}$ | 5 | 1100 | 3 |
| Example 23 | W | 3 | 90 | 15 | Air atmosphere | 1100 | 20 | $1 \times 10^{-3}$ | 5 | 1100 | 3 |
| Example 24 | V | 3 | 90 | 15 | Air atmosphere | 1100 | 20 | $1 \times 10^{-3}$ | 5 | 1100 | 3 |
| Example 25 | Nb | 3 | 90 | 15 | Air atmosphere | 1100 | 20 | $1 \times 10^{-3}$ | 5 | 1100 | 3 |
| Example 26 | Ta | 3 | 90 | 15 | Air atmosphere | 1100 | 20 | $1 \times 10^{-3}$ | 5 | 1100 | 3 |
| Example 27 | Ce | 3 | 90 | 15 | Air atmosphere | 1100 | 20 | $1 \times 10^{-3}$ | 5 | 1100 | 3 |
| Example 28 | Pr | 3 | 90 | 15 | Air atmosphere | 1100 | 20 | $1 \times 10^{-3}$ | 5 | 1100 | 3 |
| Example 29 | Gd | 3 | 90 | 15 | Air atmosphere | 1100 | 20 | $1 \times 10^{-3}$ | 5 | 1100 | 3 |
| Example 30 | Y | 3 | 90 | 15 | Air atmosphere | 1100 | 20 | $1 \times 10^{-3}$ | 5 | 1100 | 3 |
| Example 31 | Sn | 3 | 90 | 15 | Air atmosphere | 1100 | 20 | $1 \times 10^{-3}$ | 5 | 1100 | 3 |
| Example 32 | Ru | 3 | 90 | 15 | Air atmosphere | 1100 | 20 | $1 \times 10^{-3}$ | 5 | 1100 | 3 |
| Example 33 | Mg | 3 | 90 | 15 | Air atmosphere | 1100 | 20 | $1 \times 10^{-3}$ | 5 | 1100 | 3 |
| Example 34 | Ir | 3 | 90 | 15 | Air atmosphere | 1100 | 20 | $1 \times 10^{-3}$ | 5 | 1100 | 3 |
| Example 35 | Bi | 3 | 90 | 15 | Air atmosphere | 1100 | 20 | $1 \times 10^{-3}$ | 5 | 1100 | 3 |

TABLE 4

| | Donut shaped secondary particles (%) | Relative density (%) | Resistivity (Ω·cm) | Orientation | Splash occurrence |
|---|---|---|---|---|---|
| Example 13 | 60 | 60 | $6.6 \times 10^{-4}$ | 0.498 | No splash |
| Example 14 | 57 | 60 | $8.9 \times 10^{-4}$ | 0.495 | No splash |
| Example 15 | 52 | 60 | $3.1 \times 10^{-3}$ | 0.492 | No splash |
| Example 16 | 59 | 60 | $6.8 \times 10^{-3}$ | 0.508 | No splash |
| Example 17 | 61 | 60 | $3.1 \times 10^{-2}$ | 0.510 | No splash |
| Example 18 | 58 | 60 | $4.1 \times 10^{-3}$ | 0.501 | No splash |
| Example 19 | 58 | 60 | $1.2 \times 10^{-3}$ | 0.508 | No splash |
| Example 20 | 57 | 59 | $4.5 \times 10^{-2}$ | 0.492 | No splash |
| Example 21 | 59 | 59 | $7.2 \times 10^{-2}$ | 0.500 | No splash |
| Example 22 | 61 | 61 | $2.2 \times 10^{-3}$ | 0.498 | No splash |
| Example 23 | 60 | 60 | $9.4 \times 10^{-4}$ | 0.510 | No splash |
| Example 24 | 56 | 60 | $8.6 \times 10^{-2}$ | 0.505 | No splash |
| Example 25 | 60 | 62 | $8.1 \times 10^{-2}$ | 0.511 | No splash |
| Example 26 | 59 | 60 | $3.5 \times 10^{-3}$ | 0.504 | No splash |
| Example 27 | 58 | 59 | $6.9 \times 10^{-2}$ | 0.497 | No splash |
| Example 28 | 59 | 60 | $1.0 \times 10^{-1}$ | 0.511 | No splash |
| Example 29 | 62 | 60 | $2.0 \times 10^{-1}$ | 0.502 | No splash |
| Example 30 | 59 | 58 | $9.2 \times 10^{-2}$ | 0.502 | No splash |
| Example 31 | 60 | 59 | $2.1 \times 10^{-2}$ | 0.508 | No splash |
| Example 32 | 59 | 60 | $5.0 \times 10^{-2}$ | 0.509 | No splash |
| Example 33 | 63 | 62 | $2.8 \times 10^{-3}$ | 0.501 | No splash |
| Example 34 | 60 | 60 | $8.8 \times 10^{-2}$ | 0.510 | No splash |
| Example 35 | 56 | 58 | $2.2 \times 10^{-1}$ | 0.503 | No splash |

What is claimed is:

1. A zinc oxide sintered compact tablet comprising:
a zinc oxide or a zinc oxide containing a dopant, the zinc oxide or the zinc oxide containing the dopant having a hexagonal crystal structure;
wherein when an integrated intensity of diffraction peaks of a (103) crystal plane and a (110) crystal plane found through X-ray diffraction analysis using CuKα radiation for a uniaxially pressed surface of the zinc oxide sintered compact tablet is taken to be $I_{(103)}$ and $I_{(110)}$ respectively an (103) crystal plane orientation of the uniaxially pressed surface that is expressed by an equation of $I_{(103)}/(I_{(103)}+I_{(110)})$ is 0.48 or more;
wherein the uniaxially pressed surface is a sublimation surface when implementing a vacuum depositing method.

2. The zinc oxide sintered compact tablet according to claim 1, wherein the (103) crystal plane orientation is 0.5 or more.

3. The zinc oxide sintered compact tablet according to claim 1, wherein the 103 crystal plane orientation is 0.55 or more.

4. The zinc oxide sintered compact tablet according to claim 1, wherein the (103) crystal plane orientation is 0.6 or more.

5. The zinc oxide sintered compact tablet according to claim 1, wherein a resistivity is $1 \times 10^2$ Ω·cm or more.

6. The zinc oxide sintered compact tablet according to claim 1, wherein a relative density is no less than 50% and no greater than 70%.

7. A manufacturing method for a zinc oxide sintered compact tablet:
the zinc oxide sintered compact tablet comprising
a zinc oxide or a zinc oxide containing a dopant, the zinc oxide or the zinc oxide containing the dopant having a hexagonal structure;
wherein when an integrated intensity of diffraction peaks of a (103) crystal plane and a (110) crystal plane found through X-ray diffraction analysis using CuKα radiation for a uniaxially pressed surface of the zinc oxide sintered compact is taken to be $I_{(103)}$ and $I_{(110)}$ respectively an (103) crystal plane orientation of the uniaxially pressed surface that is expressed by an equation of $I_{(103)}/(I_{(103)}+I_{(110)})$ is 0.48 or more;
wherein the uniaxially pressed surface is a sublimation surface when implementing a vacuum depositing method;
the method comprising the steps of:
forming and obtaining a compact tablet by pressurizing granulated powder comprising a zinc oxide powder or a powder mixture of zinc oxide and an added element, the added element being the dopant and having a percentage of donut shaped secondary particles of 50% or more; and
sintering the compact tablet at normal pressure and at a temperature of 800° C. to 1300° C. to obtain the zinc oxide sintered compact tablet.

8. The manufacturing method for the zinc oxide sintered compact tablet according to claim 7, wherein the sintering process is performed under normal pressure and a reduction treatment is further performed by maintaining the obtained zinc oxide sintered compact tablet in a vacuum at a pressure between $1 \times 10^{-4}$ Pa and $1 \times 10^{-3}$ Pa and at a temperature of 800° C. to 1300° C. for no less than 1 minute and no longer than 10 minutes.

9. The manufacturing method for the zinc oxide sintered compact tablet according to claim 7, wherein the granulated powder is obtained by making a slurry of the base powder, which is the zinc oxide powder or the powder mixture, then spray drying the slurry at a temperature of 80° C. to 100° C. and adjusting the discharge airflow so that the percentage of donut shaped secondary particles is 50% or more.

10. The manufacturing method for the zinc oxide sintered compact tablet according to claim 9, wherein part of the granulated powder is calcinated at a temperature of 800° C. to 1300° C. for 1 hour to 30 hours.

11. The manufacturing method for the zinc oxide sintered compact tablet according to claim 10, wherein the calcinated granulated powder and non-calcinated granulated powder are mixed and used.

* * * * *